US009449961B2

(12) United States Patent
Hou et al.

(10) Patent No.: US 9,449,961 B2
(45) Date of Patent: Sep. 20, 2016

(54) PANEL DEVICE HAVING ELECTROSTATIC DISCHARGE PROTECTION

(71) Applicant: AU Optronics Corporation, Hsin-Chu (TW)

(72) Inventors: Hsiao-Ying Hou, Hsin-Chu (TW); Wen-Chi Chuang, Hsin-Chu (TW); Yi-Ling Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 154 days.

(21) Appl. No.: 14/474,375

(22) Filed: Sep. 2, 2014

(65) Prior Publication Data
US 2015/0092306 A1    Apr. 2, 2015

(30) Foreign Application Priority Data
Sep. 27, 2013  (TW) .............................. 102135049 A (51) Int. Cl.
*H02H 3/16* (2006.01)
*H01L 27/02* (2006.01)
*G06F 3/041* (2006.01)

(52) U.S. Cl.
CPC ........... *H01L 27/0296* (2013.01); *G06F 3/041* (2013.01)

(58) Field of Classification Search
CPC ...... H02H 3/16; H01L 27/0296; G06F 3/041
USPC ....................................................... 361/220
See application file for complete search history.

(56) References Cited

U.S. PATENT DOCUMENTS

| 6,900,969 | B2 | 5/2005 | Salling et al. |
| 7,348,643 | B2 * | 3/2008 | Boselli ................. H01L 23/585 257/355 |
| 8,320,097 | B2 * | 11/2012 | Lin ....................... G06F 3/0418 361/220 |

(Continued)

FOREIGN PATENT DOCUMENTS

| TW | I248185 | 1/2006 |
| TW | 200801753 | 1/2008 |

(Continued)

OTHER PUBLICATIONS

English translation of abstract of TW 200801753 (published Jan. 1, 2008).

(Continued)

*Primary Examiner* — Scott Bauer
(74) *Attorney, Agent, or Firm* — McClure, Qualey & Rodack, LLP (57) ABSTRACT

A display device includes a substrate, at least one signal circuit, a ground protection circuit, and an auxiliary protection circuit. The substrate has a first surface, wherein the first surface includes an active area and a frame area surrounding the active area. The at least one signal circuit is disposed and extending along the frame area and electrically coupled to the active area. The ground protection circuit is disposed and extending along the frame area, wherein the ground protection circuit is positioned at a side of the signal circuit facing an edge of the substrate. The auxiliary protection circuit is disposed and extending along the frame area. The auxiliary protection circuit is disposed between the signal circuit and the ground protection circuit, wherein the auxiliary protection circuit respectively has a gap with the signal circuit and the ground protection circuit, and is electrically conductive.

20 Claims, 8 Drawing Sheets

(56) References Cited

U.S. PATENT DOCUMENTS

| | | | |
|---|---|---|---|
| 2005/0195338 A1* | 9/2005 | Matsumoto | G02F 1/136204 349/40 |
| 2006/0203403 A1* | 9/2006 | Schediwy | G06F 3/03547 361/56 |
| 2008/0079859 A1* | 4/2008 | Ota | G02F 1/136204 349/40 |
| 2011/0157084 A1 | 6/2011 | Huang et al. | |
| 2014/0028582 A1* | 1/2014 | Choi | G06F 3/041 345/173 |
| 2015/0327411 A1* | 11/2015 | Huang | H05K 9/0079 361/220 |

FOREIGN PATENT DOCUMENTS

| | | |
|---|---|---|
| TW | 200901013 A | 1/2009 |
| TW | M420761 U1 | 1/2012 |

OTHER PUBLICATIONS

English translation of abstract of TW I248185 (published Jan. 21, 2006).

Taiwan Office Action dated Mar. 4, 2014 in corresponding Taiwan application No. 102135049.

* cited by examiner

PANEL DEVICE HAVING ELECTROSTATIC DISCHARGE PROTECTION

CROSS-REFERENCE TO RELATED APPLICATIONS

This application claims priority to Taiwan Application Serial Number 102135049, filed Sep. 27, 2013, which is incorporated by reference herein in its entirety.

BACKGROUND OF THE INVENTION

1. Field of the Invention

The present invention generally relates to a panel device; particularly, the present invention relates to a panel device having electrostatic discharge protection and can protect signal circuits.

2. Description of the Related Art

In everyday life, touch-sensitive mobile devices or touch-sensitive electronic devices have vastly transformed people's lifestyle. For instance, touch-sensitive tablet computers have permeated every level of society with their ability to increase convenience in life as well as provide intelligent services. Generally, when designing electronic devices and under circumstances of not changing the total surface area of a product, developers will usually increase the surface area of the touch-sensitive display while trying to shrink the surface area of the border frame. However, as the surface area of the touch-sensitive display increases, the touch-sensitive display circuit will get closer to the outer edges of the product.

In actual circumstances, the electronic device is required to pass an electrostatic discharge test (ESD Test) to ensure the electronic device has sufficient electrostatic protection capabilities. Electrostatic discharge testing includes contact discharge and air discharge. Air discharge is conducted to simulate discharges in the insulation area of the product from hand contact in order to test the tolerance levels. Typically, researcher and developers will install ground circuits beside the touch-sensitive display circuit to provide a conduction path for electrostatic charges and thereby increasing the electrostatic tolerances of the product. It should be noted that since the border frame area has been shrunken, the touch-sensitive display circuit and the ground circuit are disposed tightly in parallel.

In addition, in terms of space discharge testing on the entire device module, the sides of the product typically come under electrostatic discharge attacks and result in signals being rerouted off course as a sign of underwhelming electrostatic tolerances. Even if electrostatic charges are conducted to the ground circuit, electrostatic sparks would still be generated, wherein the electrostatic spark can mole its way to the touch-sensitive display signal circuit to cause abnormal performances in the product. These effects are particularly evident in current mainstream narrow border devices. In other words, the electrostatic tolerances of conventional electronic devices are not particularly satisfactory and are not able to effectively solve the problem of electrostatic discharge attacks.

SUMMARY OF THE INVENTION

According to the mentioned problems with the prior art, the present invention provides a panel device capable of preventing or decreasing electrostatic discharge attacks on circuits while also increasing electrostatic protection levels.

It is an object of the present invention to provide a panel device for preventing or decreasing circuits from being assaulted by electrostatic discharges and to increase electrostatic discharge protection.

It is another object of the present invention to provide a panel device having an auxiliary protection circuit capable of providing a conduction path for electrostatic charge potential.

It is yet another object of the present invention to provide a panel device with adjusted protection circuit surface area to increase electrostatic charge dissipation surface area.

The panel device includes a substrate, at least a signal circuit, a ground protection circuit, and an auxiliary protection circuit. In an embodiment, the substrate has a first surface, wherein the first surface includes an active area and a frame area surrounding the active area. In addition, at least a signal circuit is disposed in the frame area, extending along the frame area and electrically coupled to the active area. The ground protection circuit is disposed in the frame area and extends along the frame area, wherein the ground protection circuit is positioned at a side of the signal circuit facing the edge of the substrate.

In more concrete terms, the auxiliary protection circuit is disposed extending along the frame area and being sandwiched between the signal circuit and the ground protection circuit, wherein the auxiliary protection circuit respectively has a gap with the signal circuit and the ground protection circuit, and the auxiliary protection circuit is electrically conductive.

In comparison to the prior art, the panel device of the present invention uses the auxiliary protection circuit to form a conduction area for electrostatic charges in order to dissipate the electrostatic charges. In actual circumstances, the auxiliary protection circuit is disposed between the signal circuit and the ground protection circuit to act as a conduction path for electrostatic charges and thereby prevent the signal circuit from electrostatic discharges. In further terms, the present invention further explains the corresponding width relationship between the auxiliary protection circuit and the ground protection circuit in order to increase protection from electrostatic discharges.

DETAILED DESCRIPTION OF THE PREFERRED EMBODIMENT

According to an embodiment of the present invention, a panel device having electrostatic discharge protection is provided. Particularly, the panel device of the present invention may be a touch panel or display panel applicable for use in tablet computers, mobile telephones, laptop computers, or any other electronic devices without any particular limitations.

Figure 1A:
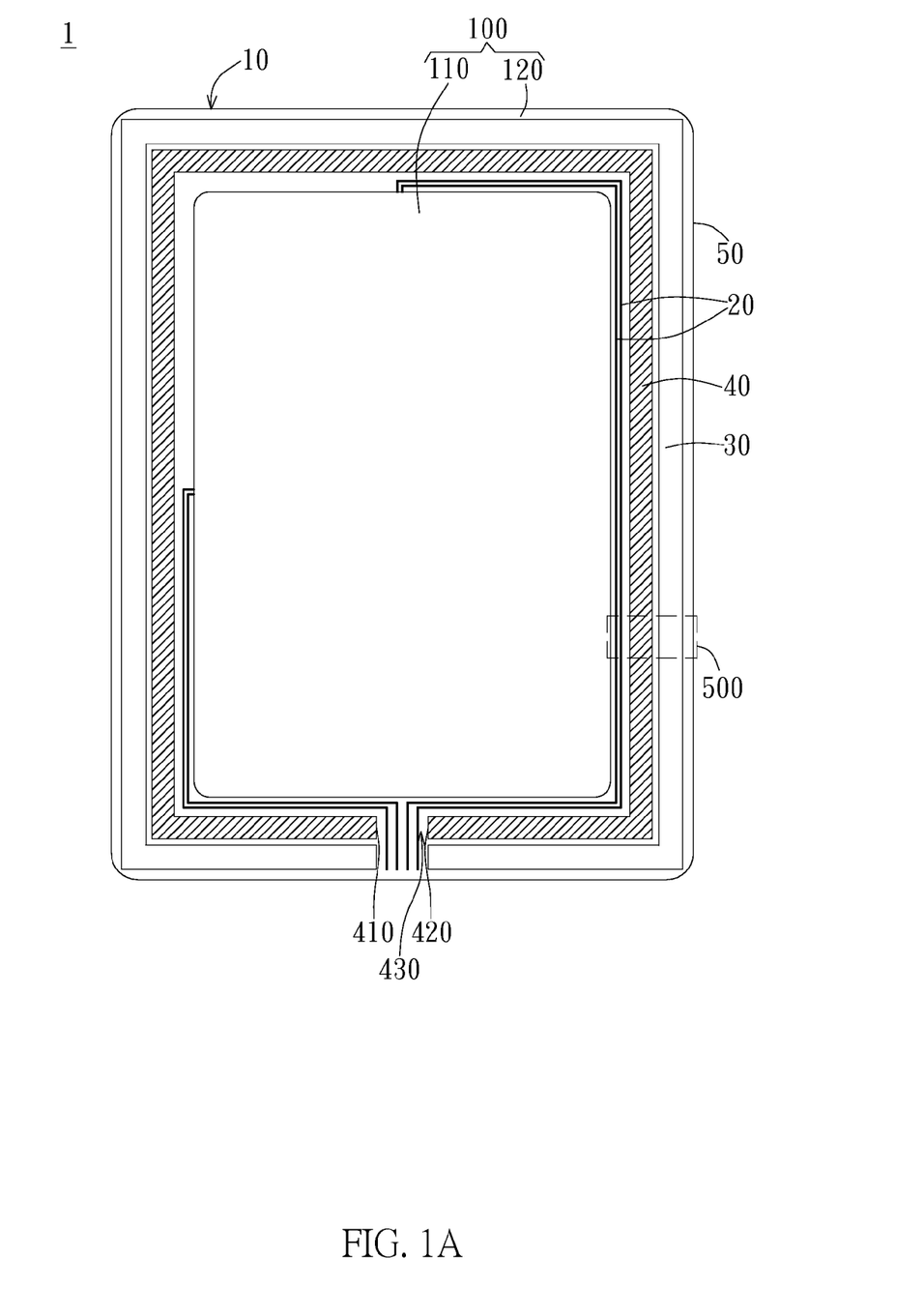
FIG. 1A is an embodiment of the panel device of the present invention.

Please refer to FIG. 1A of an illustration of an embodiment of the panel device 1 of the present invention. In the present embodiment, the panel device 1 is preferably a touch panel device. The panel device 1 includes a substrate 10, at least a signal circuit 20, a ground protection circuit 30, and an auxiliary protection circuit 40. As shown in FIG. 1A, the substrate 10 has a first surface 100, wherein the first surface 100 includes an active area 110 and a frame area 120 surrounding the active area 110. In the present embodiment, the substrate 10 is a touch panel substrate, and the active area 110 has a plurality of sensing electrodes for users to engage in touch controls in the active area 110. In addition, the frame area 120 is a non-touch area surrounding the active area 110. Typically, the frame area 120 is disposed as an opaque frame border.

Figure 1B:
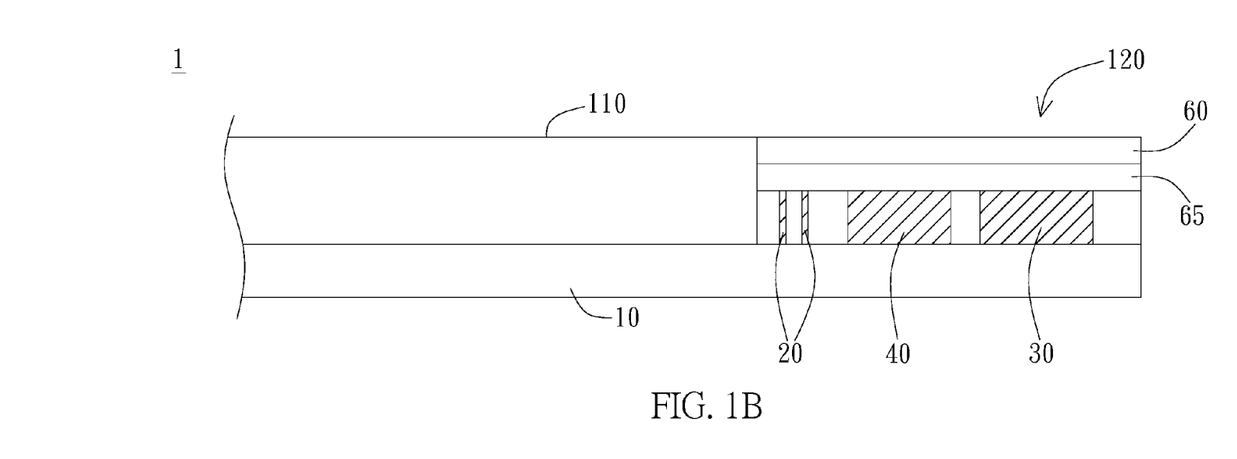
FIG. 1B is a cross-sectional view of an embodiment of the panel device of the present invention.

The signal circuit 20, the ground protection circuit 30, and the auxiliary protection circuit 40 are disposed in the frame area 120. In more preferable terms, an opaque frame 60 covers the frame area 120. Illustrated in FIG. 1B is a cross-sectional diagram of an embodiment of the panel device of the present invention. In the present embodiment, the opaque frame 60 is disposed opposite the substrate 10. The signal circuit 20, the ground protection circuit 30, and the auxiliary protection circuit 40 are disposed between the opaque frame 60 and the substrate 10, wherein an insulating layer 65 is disposed above those circuits. In practice, the opaque frame 60 is for preventing exposure of the signal circuit 20, the ground protection circuit 30, and the auxiliary protection circuit 40 while improving the aesthetics. However, the relative positioning between the components are not limited to the presently mentioned embodiment.

In addition, the signal circuit 20 is primary distributed to the area close to the active area 110; however, the signal circuit 20 is not limited to this. In the present embodiment, the non-closed ring-shape formed by the auxiliary protection circuit 40 has a first end 410 and a second end 420. The first end 410 and the second end 420 form an opening 430 to allow the signal circuit 20 to jut out of the auxiliary protection circuit 40 from between the first end 410 and the second end 420. In more concrete terms, the auxiliary protection circuit 40 forms the non-closed ring-shaped circuit through the opening 430, wherein the opening 430 becomes the crossover path for the signal circuit 20. In practice, the signal circuit 20 may change layers between the first end 410 and the second end 420, wherein changing layers includes a top layer of the substrate 10 passing through the substrate 10 to change to a bottom layer of the substrate 10; however, no limitations are implied or imposed thereof.

In the present embodiment, the signal circuit 20 and the ground protection circuit 30 respectively extend along the frame area 120, wherein the signal circuit 20 is electrically coupled to the active area 110. As illustrated in FIG. 1A, the frame area 120 is the frame border surrounding the active area 110, and the signal circuit 20 and the ground protection circuit 30 extend surrounding the periphery of the active area 110. In addition, the ground protection circuit 30 is positioned at a side of the signal circuit 20 facing an edge 50 of the substrate 10. As shown in FIG. 1A, the ground protection circuit 30 is positioned at the outmost side of the first surface 100 of the substrate 10 to enable the ground protection circuit 30 to first absorb electrostatic discharges from outside of the substrate 10.

As illustrated in FIG. 1A, the auxiliary protection circuit 40 extends along the frame area 120, sandwiched between the signal circuit 20 and the ground protection circuit 30. In addition, the auxiliary protection circuit 40 is a conductor having conductive properties. In other words, the order of the circuits on the frame area 120 in the direction from the edge 50 of the substrate 10 to the center of the substrate 10 is as follows: ground protection circuit 30, auxiliary protection circuit 40, and signal circuit 20.

As shown in FIG. 1A, the auxiliary protection circuit 40 forms a non-closed ring shape surrounding the active area 110 and at least a portion or the entirety of the signal circuit 20. In more concrete terms, the ground protection circuit 30 is able to provide preliminary electrostatic protection such that electric charges may be first dissipated on the ground protection circuit 30. When the ground protection circuit 30 is not able to sustain or bear high-voltage electrostatic discharges, which results in electric charges being transferred to other areas besides the ground protection circuit 30, the auxiliary protection circuit 40 can further provide a conduction path for the electric charges in order to prevent the signal circuit 20 and the sensing electrodes of the active area 110 from being attacked by electrostatic discharges. When the electrostatic charges are channeled in the frame area 120, the charges will try to find the best possible conduction path to flow. The ground protection circuit 30 is connected to the ground level surface, wherein it is typically designed with lower resistance to provide for the electrostatic charges a good conduction dissipation path. However, in practice, other than circuit designers having a hard time predicting the conduction path of the electrostatic charges, electrostatic discharges often jump out of the ground protection circuit 30 in the form of sparks to attack neighboring circuits. This often results in abnormalities or total malfunctioning of the panel board. Therefore, the panel device 1 can provide further electrostatic protection through the auxiliary protection circuit 40.

Figure 1C:
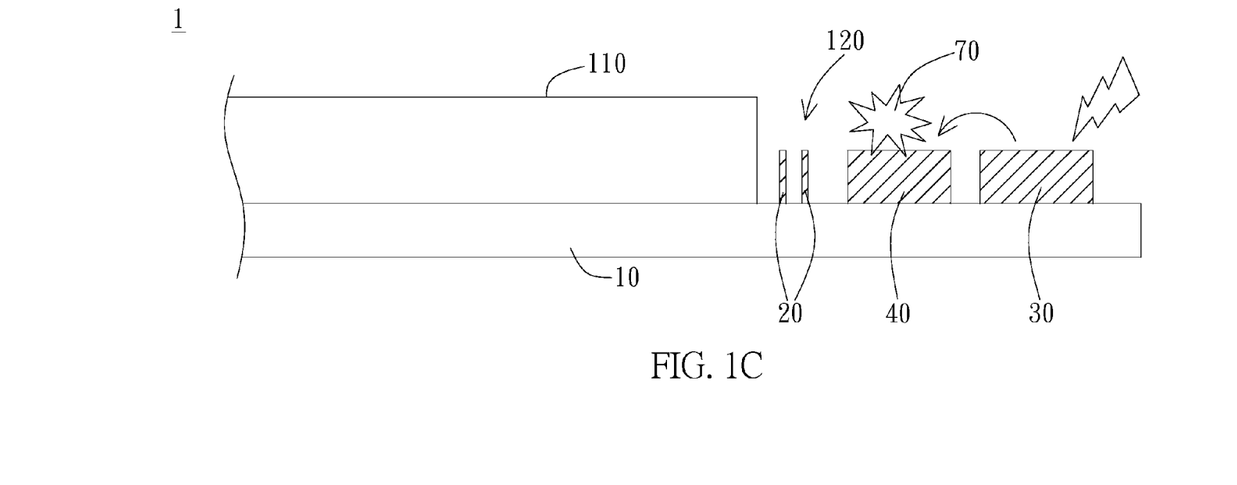
FIG. 1C is a schematic view of a spark of an electrostatic discharge jumping from the ground protection circuit to the auxiliary protection circuit.

It's worthy to note that since the auxiliary protection circuit 40 is disposed between the signal circuit 20 and the ground protection circuit 30, the auxiliary protection circuit 40 can provide a potential conduction path for the electrostatic charges (spark) and prevent the signal circuit 20 and the sensing electrodes from coming under electrostatic attack. Referring to FIG. 1C, FIG. 1C is a diagram of a spark of the electrostatic charge jumping from the ground protection circuit 30 to the auxiliary protection circuit 40. After the ground protection circuit 30 is under attack by electrostatic charges, an electrostatic spark 70 is generated. The auxiliary protection circuit 40 provides a channel path for the electrostatic spark 70 to prevent the electrostatic spark 70 from jumping to the signal circuit 20 or the active area 110. In addition, the auxiliary protection circuit 40 forms as an individual or independent circuit that is not connected with any other circuits. In this manner, the electrostatic charges can only stay within the auxiliary protection circuit 40 and will not be able to leak to any other circuits. In more definite terms, the auxiliary protection circuit 40 is electrically independent such that the auxiliary protection circuit 40 is electrically isolated from any other circuits; hence, the auxiliary protection circuit 40 is an independent circuit. Since the ground protection circuit 30 has already done preliminary dissipation of the electrostatic charges and the auxiliary protection circuit 40 is an independent circuit, the auxiliary protection circuit 40 is able to effectively dissipate any remaining electrostatic charges and become a terminal area for the electrostatic charge to hide.

Figure 1D:
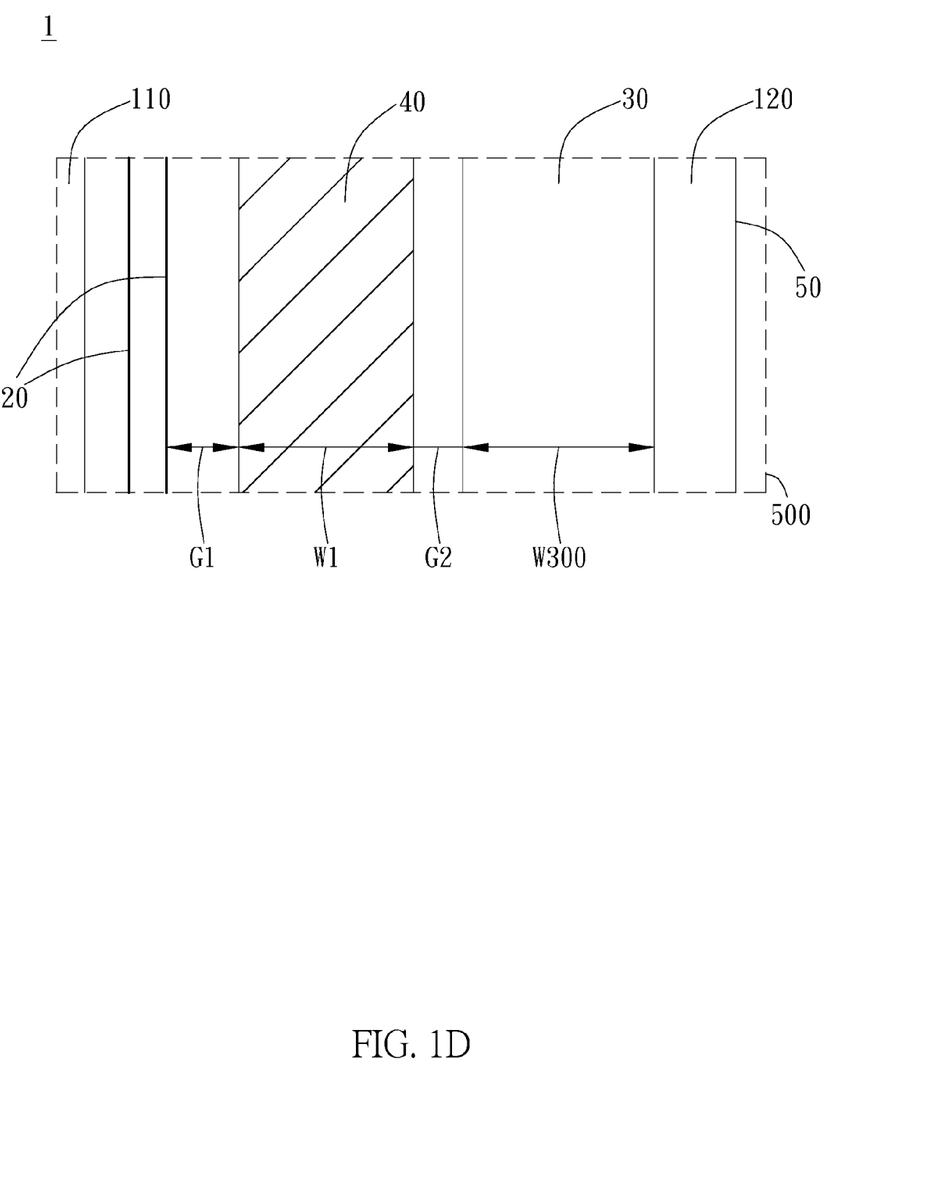
FIG. 1D is a partially enlarged view of an embodiment of the panel device of the present invention.

Please refer to FIG. 1D. FIG. 1D is a partially enlarged view of an embodiment of the panel device of the present invention. It should be noted that FIG. 1D is the enlarged view of the dotted line block 500 of FIG. 1A. As illustrated in FIG. 1D, the auxiliary protection circuit 40 respectively has a gap G1 and a gap G2 with the signal circuit 20 and the ground protection circuit 30. On the frame area 120, conductors or electronic components are preferably not disposed between the auxiliary protection circuit 40 and signal circuit 20, as well as between the auxiliary protection circuit 40 and the ground protection circuit 30. In other words, the electrostatic charge can only be conducted through the space distribution between the auxiliary protection circuit 40 and the signal circuit 20 as well as between the auxiliary protection circuit 40 and the ground protection circuit 30.

Furthermore, the gap G2 between the auxiliary protection circuit 40 and the ground protection circuit 30 is smaller than the gap G1 between the auxiliary protection circuit 40 and the signal circuit 20. In other words, since the gap G2 is smaller than the gap G1, electrostatic charges will relatively more easily jump through the space distribution from the ground protection circuit 30 to the auxiliary protection circuit 40, wherein the auxiliary protection circuit 40 can then effectively dissipate the electrostatic charge. In addition, since the gap G1 is bigger than the gap G2, the electrostatic charge will not leak as easily to the signal circuit 20 from the auxiliary protection circuit 40. In the present embodiment, the way panel device 1 positions the auxiliary protection circuit 40 and adjusts the size of the gaps G1 and G2 will effectively increase electrostatic discharge protection and accomplish the effect of protecting the signal circuit 20.

In more concrete terms, the auxiliary protection circuit 40 has a horizontal width W1, and the ground protection circuit 30 has a horizontal width W300, wherein the range of the horizontal width W1 of the auxiliary protection circuit 40 is between 30 μm to 500 μm. In addition, in the present embodiment, there is no particular limitation or restriction in the corresponding sizes between the horizontal width W1 of the auxiliary protection circuit 40 and the horizontal width W300 of the ground protection circuit 30. The horizontal widths W1 and W300 may be adjusted according to actual requirements. Furthermore, in comparison to conventional electronic devices, the panel device 1 utilizes the auxiliary protection circuit 40 to dissipate electrostatic charges, thereby increasing the electrostatic charge tolerance rate by 2 kV and effectively providing an effective electrostatic discharge protection.

Figure 2:
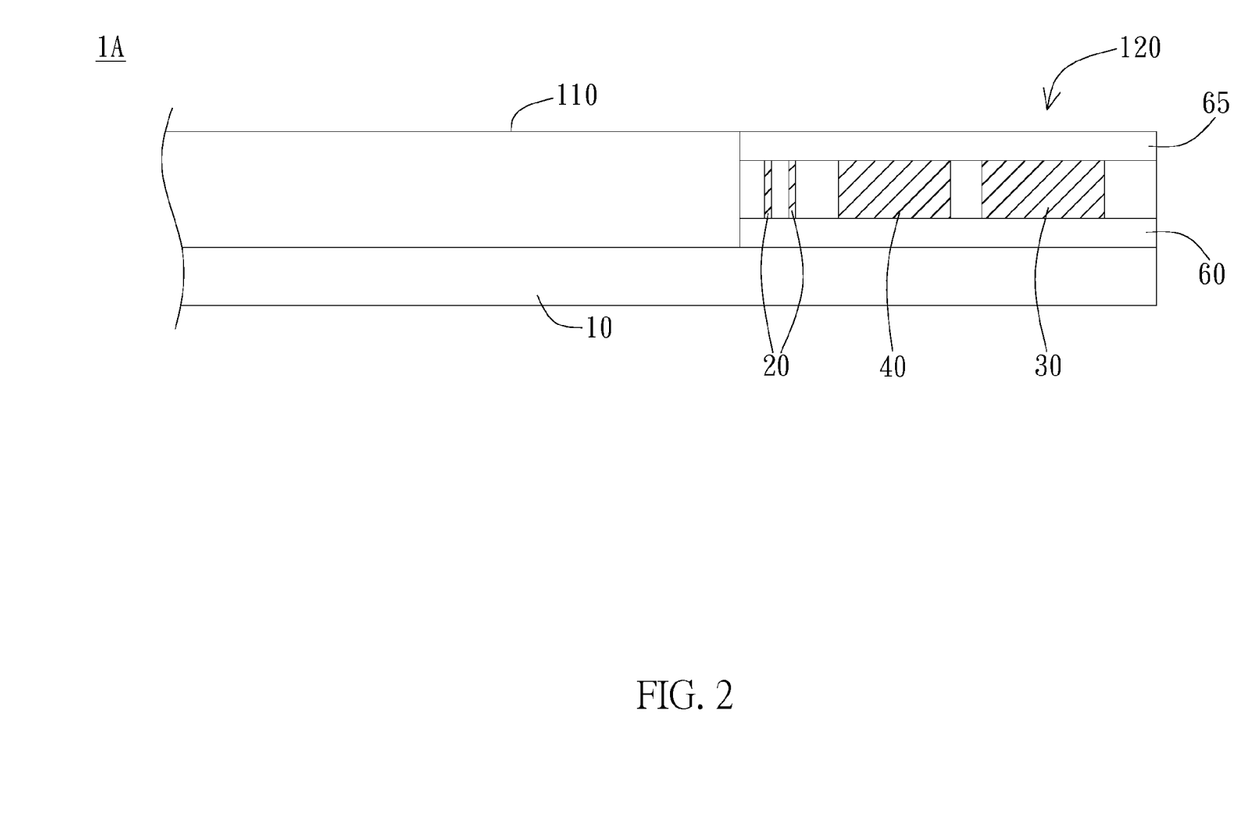
FIG. 2 is a cross-sectional view of another embodiment of the panel device.

Please refer to FIG. 2. FIG. 2 is a cross-sectional view of another embodiment of the panel device of the present invention. In comparison to the panel device 1 of FIG. 1B, the embodiment in FIG. 2 discloses a panel device 1A, wherein the opaque frame 60 is disposed above the substrate 10. In the present embodiment, the signal circuit 20, the ground protection circuit 30, and the auxiliary protection circuit 40 are disposed above the opaque frame 60, and the insulating layer 65 is disposed above those circuits. In other words, the signal circuit 20, the ground protection circuit 30, and the auxiliary protection circuit 40 are disposed between the insulating layer 65 and the opaque frame 60.

Figure 3A:
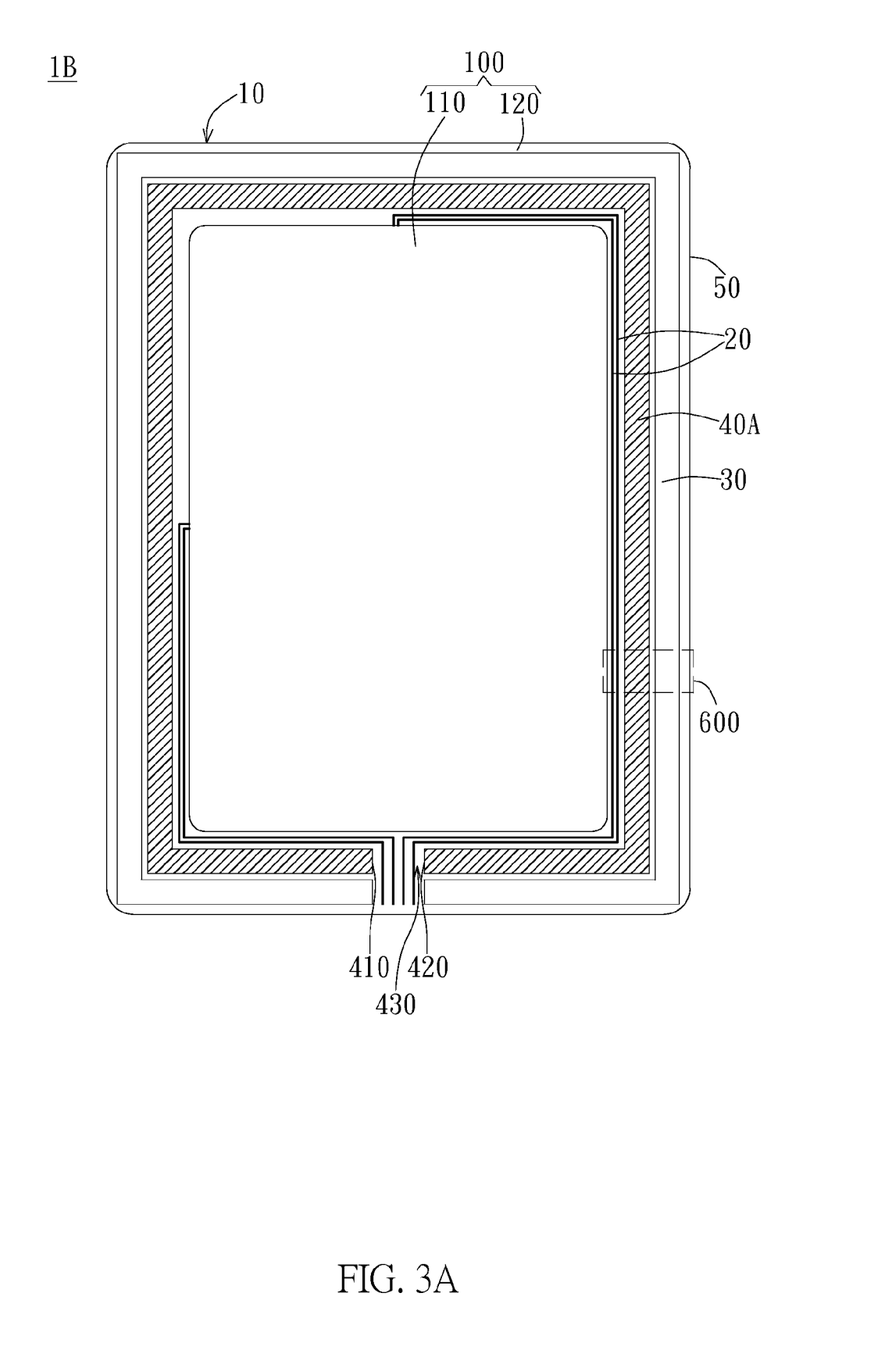
FIG. 3A is a schematic view of another embodiment of the panel device.
Figure 3B:
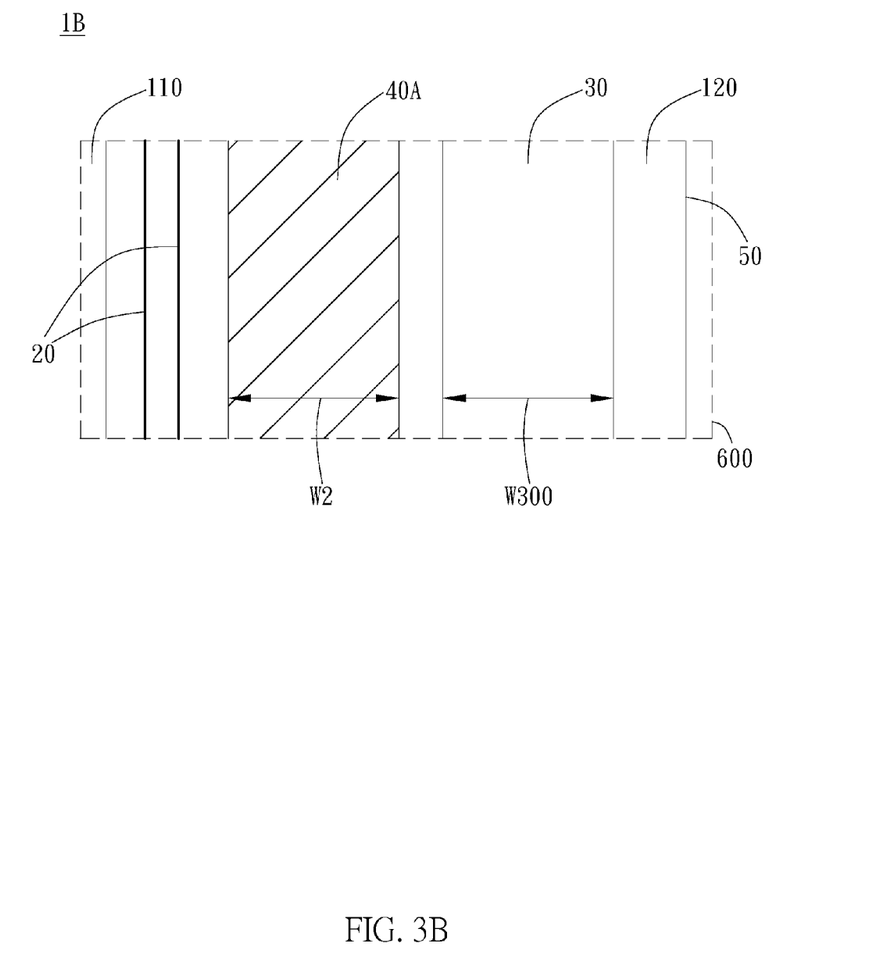
FIG. 3B is a partially enlarged view of another embodiment of the panel device.

Please refer to FIGS. 3A and 3B. FIG. 3A is another embodiment of the panel device 1B of the present invention. FIG. 3B is a partially enlarged view of another embodiment of the panel device 1B. It should be noted that FIG. 3B is the enlarged diagram of the dotted line block 600 in FIG. 3A. In the present embodiment, the horizontal width W2 of the auxiliary protection circuit 40A of the panel device 1B is not smaller than the horizontal width 300 of the ground protection circuit 30. In more definite terms, the ratio of the horizontal width W2 of the auxiliary protection circuit 40A and the horizontal width W300 of the ground protection circuit 30 is substantially greater than or equal to 1. In other words, the horizontal width W2 of the auxiliary protection circuit 40A is greater than or equal to the horizontal width W300 of the ground protection circuit 30. In the present embodiment, the ratio of the horizontal width W2 of the auxiliary protection circuit 40A and the horizontal width W300 of the ground protection circuit 30 is equal to 1. In practice, since the auxiliary protection circuit 40A and the ground protection circuit 30 have the same width, the auxiliary protection circuit 40A has enough surface area to dissipate electrostatic charges and in turn be able to protect the signal circuit 20.

Figure 4A:
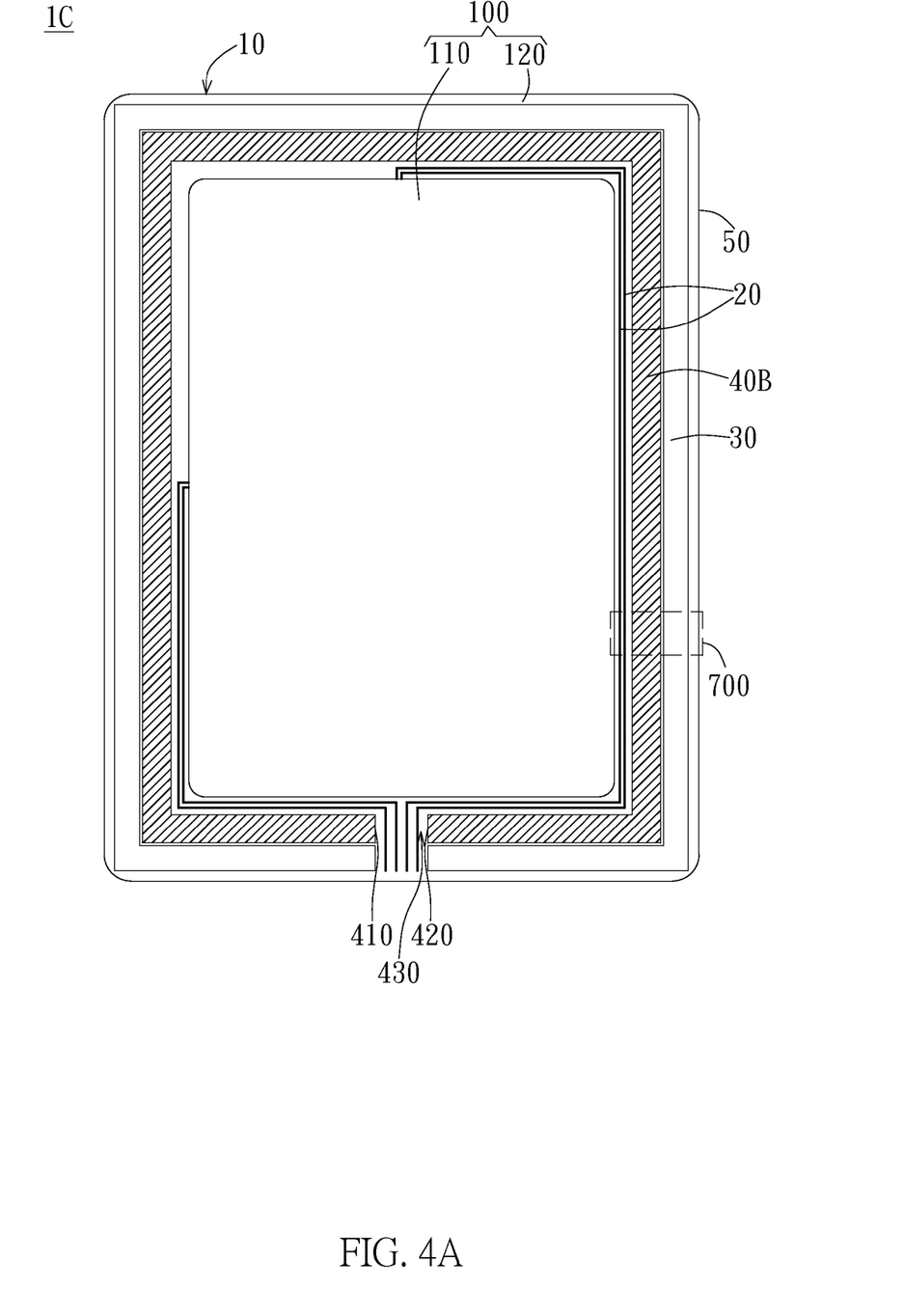
FIG. 4A is a schematic view of another embodiment of the panel device.
Figure 4B:
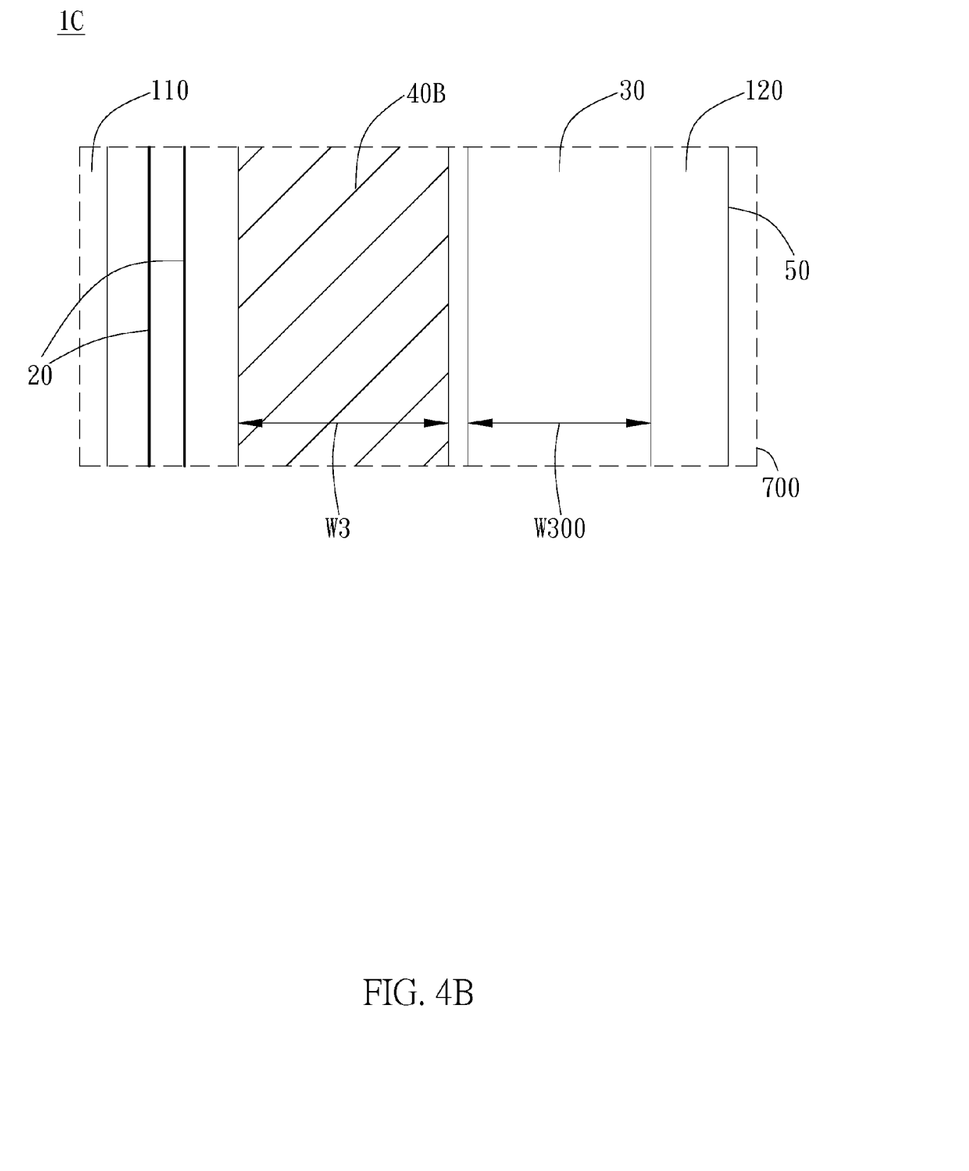
FIG. 4B is a partially enlarged view of another embodiment of the panel device.

Please refer to FIGS. 4A and 4B. FIG. 4A is another embodiment of the panel device 1B, while FIG. 4B is a partially enlarged view of another embodiment of the panel device. In the present embodiment, a horizontal width W3 of the auxiliary protection circuit 40B of the panel device 1B is greater than the horizontal width W300 of the ground protection circuit 30. In other words, the ratio of the horizontal width W3 of the auxiliary protection circuit 40B and the horizontal width W300 of the ground protection circuit 30 is greater than 1. In comparison to the panel device 1 and 1B of FIGS. 1A and 3A, the auxiliary protection circuit 40B further has ample conduction surface area for electrostatic charges to dissipate, thereby greatly increasing electrostatic discharge protection levels.

It should be noted that no matter which panel device 1, 1A, 1B, or 1C, if there is enough space in frame area 120, it is preferable to increase the gap G1 between the auxiliary protection circuit 40 and the signal circuit 20 to decrease the chances of the electrostatic charge channeling on the distribution space such that the electrostatic charge would have difficulties trying to jump from the auxiliary protection circuit 40 to the signal circuit 20 or sensing electrodes of the active area. For instance, as shown in FIG. 1D, the gap G1 is preferably enlarged to increase the distance between the auxiliary protection circuit 40 and the signal circuit 20.

In addition, in an embodiment, the auxiliary protection circuit 40 can be disposed as close as possible to the ground protection circuit 30 to guide the electrostatic charge to transfer from the ground protection circuit 30 to the auxiliary protection circuit 40. For instance, as shown in FIG. 1D, the gap G2 may be shortened to increase the chances that the ground protection circuit 30 cannot leak any leftover electrostatic discharges to anywhere else other than the auxiliary protection circuit 40.

In comparison to the prior art, according to the present invention, the panel device 1 utilizes the auxiliary protection circuit 40 to form a channel area or conduction area for electrostatic charges in order to dissipate the electrostatic charges. In practice, the auxiliary protection circuit 40 is disposed between the signal circuit 20 and the ground protection circuit 30, thereby providing a conduction path for electrostatic discharges in order to prevent the signal circuit 20 and the sensing electrodes from being attacked by electrostatic discharges. In addition, the corresponding width relationship between the auxiliary protection circuit 40 and the ground protection circuit 30 mentioned above helps to increase electrostatic discharge protection levels.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A panel device, comprising:
   a substrate having a first surface, wherein the first surface comprises an active area and a frame area surrounding the active area;
   at least a signal circuit disposed and extending along the frame area and electrically coupled to the active area;
   a ground protection circuit disposed and extending along the frame area, wherein the ground protection circuit is positioned at a side of the signal circuit facing an edge of the substrate; and
   an auxiliary protection circuit disposed and extending along the frame area, wherein the auxiliary protection circuit is sandwiched between the signal circuit and the ground protection circuit, wherein the auxiliary protection circuit is formed as an independent circuit not connected with any other circuits;
   wherein the auxiliary protection circuit respectively has a gap with the signal circuit
   and the ground protection circuit, and the auxiliary protection circuit is electrically conductive.

2. The panel device of claim 1, wherein a ratio between the horizontal width of the auxiliary protection circuit and the horizontal width of the ground protection circuit is greater than or equal to 1.

3. The panel device of claim 1, wherein the horizontal width of the auxiliary protection circuit is greater than the horizontal width of the signal circuit.

4. The panel device of claim 1, wherein a horizontal width of the auxiliary protection circuit is no smaller than the horizontal width of the ground protection circuit.

5. The panel device of claim 4, wherein the gap between the auxiliary protection circuit and the ground protection circuit is smaller than the gap between the auxiliary protection circuit and the signal circuit.

6. The panel device of claim 4, wherein a ratio between the horizontal width of the auxiliary protection circuit and the horizontal width of the ground protection circuit is greater than or equal to 1.

7. The panel device of claim 4, wherein the horizontal width of the auxiliary protection circuit is greater than the horizontal width of the signal circuit.

8. The panel device of claim 1, wherein the auxiliary protection circuit is formed as a non-closed ring-shape surrounding the active area and at least a portion of the signal circuit.

9. The panel device of claim 8, wherein a ratio between the horizontal width of the auxiliary protection circuit and the horizontal width of the ground protection circuit is greater than or equal to 1.

10. The panel device of claim 8, wherein the horizontal width of the auxiliary protection circuit is greater than the horizontal width of the signal circuit.

11. The panel device of claim 8, wherein the non-closed ring-shape formed by the auxiliary protection circuit has a first end and a second end, and the signal circuit juts out of the auxiliary protection circuit from between the first end and the second end.

12. The panel device of claim 11, wherein a ratio between the horizontal width of the auxiliary protection circuit and the horizontal width of the ground protection circuit is greater than or equal to 1.

13. The panel device of claim 11, wherein the horizontal width of the auxiliary protection circuit is greater than the horizontal width of the signal circuit.

14. The panel device of claim 1, wherein the active area has a plurality of sensing electrodes.

15. The panel device of claim 14, wherein a ratio between the horizontal width of the auxiliary protection circuit and the horizontal width of the ground protection circuit is greater than or equal to 1.

16. The panel device of claim 14, wherein the horizontal width of the auxiliary protection circuit is greater than the horizontal width of the signal circuit.

17. A panel device, comprising:
    a substrate having a first surface, wherein the first surface comprises an active area and a frame area surrounding the active area;
    at least a signal circuit disposed and extending along the frame area and electrically coupled to the active area;
    a ground protection circuit disposed and extending along the frame area, wherein the ground protection circuit is positioned at a side of the signal circuit facing an edge of the substrate; and
    an auxiliary protection circuit disposed and extending along the frame area, wherein the auxiliary protection circuit is sandwiched between the signal circuit and the ground protection circuit;
    wherein the auxiliary protection circuit respectively has a gap with the signal circuit
    and the ground protection circuit, and the auxiliary protection circuit is electrically conductive, wherein the gap between the auxiliary protection circuit and the ground protection circuit is smaller than the gap between the auxiliary protection circuit and the signal circuit.

18. The panel device of claim 17, wherein a ratio between the horizontal width of the auxiliary protection circuit and the horizontal width of the ground protection circuit is greater than or equal to 1.

19. The panel device of claim 17, wherein the horizontal width of the auxiliary protection circuit is greater than the horizontal width of the signal circuit.

20. The panel device of claim 17, wherein the auxiliary protection circuit is formed as a non-closed ring-shape surrounding the active area and at least a portion of the signal circuit.

* * * * *